(12) United States Patent
Chen

(10) Patent No.: US 12,414,324 B2
(45) Date of Patent: Sep. 9, 2025

(54) SEMICONDUCTOR DEVICE AND FABRICATION METHOD THEREOF

(71) Applicant: Ark Semiconductor Corp. Ltd., Shenzhen (CN)

(72) Inventor: Chin-Fu Chen, Hsinchu County (TW)

(73) Assignee: Ark HDPS Semiconductor Pte. LIMITED., Singapore (SG)

( * ) Notice: Subject to any disclaimer, the term of this patent is extended or adjusted under 35 U.S.C. 154(b) by 412 days.

(21) Appl. No.: 18/122,726

(22) Filed: Mar. 17, 2023

(65) Prior Publication Data
US 2023/0327016 A1    Oct. 12, 2023

(30) Foreign Application Priority Data

Apr. 7, 2022   (CN) .......................... 202210361348.8

(51) Int. Cl.
*H10D 30/66*   (2025.01)
*H10D 30/01*   (2025.01)
*H10D 64/00*   (2025.01)
*H10D 64/27*   (2025.01)

(52) U.S. Cl.
CPC ....... *H10D 30/668* (2025.01); *H10D 30/0297* (2025.01); *H10D 64/117* (2025.01); *H10D 64/513* (2025.01)

(58) Field of Classification Search
CPC ............... H10D 30/668; H10D 64/117; H10D 30/0297; H10D 64/513
USPC ......................................................... 257/330
See application file for complete search history.

(56) References Cited

U.S. PATENT DOCUMENTS

| | | |
|---|---|---|
| 8,546,880 B2 | 10/2013 | Lee |
| 10,910,478 B1 | 2/2021 | Xu |
| 2010/0230747 A1 | 9/2010 | Barletta |
| 2016/0329413 A1 | 11/2016 | Jin |
| 2016/0336394 A1* | 11/2016 | Hu .................. H10D 64/117 |
| 2017/0069752 A1 | 3/2017 | Tajima |
| 2019/0165165 A1 | 5/2019 | Kawai |
| 2021/0257460 A1* | 8/2021 | Rahimo ............ H10D 12/441 |
| 2022/0384594 A1* | 12/2022 | Xu .................... H10D 30/0297 |

FOREIGN PATENT DOCUMENTS

TW    202137554 A    10/2021

* cited by examiner

*Primary Examiner* — Igwe U Anya
(74) *Attorney, Agent, or Firm* — Winston Hsu

(57) ABSTRACT

A semiconductor device includes an epitaxial layer on a substrate, a first body region and a first trench gate structure in the epitaxial layer, a first planar gate and a first source electrode on the epitaxial layer, a first source region in the first body region, and a drain electrode under the substrate. The first trench gate structure is extended along a first direction and adjacent to the first body region. The first planar gate is extended along a second direction and at least partially located directly above the first body region. There is a non-zero included angle between the second direction and the first direction. The first source electrode is extended downward into the first body region. The first source region is at least partially adjacent to the first source electrode.

20 Claims, 13 Drawing Sheets

SEMICONDUCTOR DEVICE AND FABRICATION METHOD THEREOF

BACKGROUND OF THE INVENTION

1. Field of the Invention

The present disclosure relates generally to semiconductor technology, and more particularly to semiconductor devices of power transistors including a trench gate and a planar gate and fabrication methods thereof.

2. Description of the Prior Art

Power transistors are transistors that work under high-voltage and high-current conditions. The common power transistors are for example power metal oxide semiconductor field effect transistors (power MOSFETs), which may be used in many different fields, such as power supplies, DC-to-DC converters, low-voltage motor controllers, etc.

In recent years, with the developments of various electronic products, the power and the layout density of power MOSFETs are also increased, and the frequency of power MOSFETs applied in a DC-DC converter is also increased significantly. The current power MOSFET technologies such as power transistors of split gate trench (SGT), laterally-diffused metal-oxide semiconductor (LDMOS), U-shaped trench metal-oxide semiconductor (UMOS), etc., are difficult to satisfy the requirements of electronic products in all aspects. For example, it is difficult to achieve the following effects at the same time: reducing the chip area, increasing the layout density of components, increasing the current and reducing the switching loss, etc. Therefore, there is a need to develop new power transistors to overcome the above issues.

SUMMARY OF THE INVENTION

In view of this, the present disclosure provides semiconductor devices of power transistors including a trench gate and a planar gate to satisfy various requirements of electronic products, such as reducing the chip area, increasing the layout density of transistors, increasing the current and reducing the switching loss of the semiconductor devices, etc.

According to one embodiment of the present disclosure, a semiconductor device is provided and includes a substrate, an epitaxial layer, a first body region, a first trench gate structure, a first planar gate, a first source electrode, a first source region and a drain electrode. The epitaxial layer is disposed on the substrate. The first body region is disposed in the epitaxial layer. The first trench gate structure is disposed in the epitaxial layer, extended along a first direction and is adjacent to the first body region. The first planar gate is disposed on the epitaxial layer, extended along a second direction and is at least partially located directly above the first body region, where the second direction and the first direction have a non-zero included angle therebetween. The first source electrode is disposed on the epitaxial layer and extended downward into the first body region. The first source region is disposed in the first body region and at least partially adjacent to the first source electrode. The drain electrode is disposed under the substrate.

According to one embodiment of the present disclosure, a method of fabricating a semiconductor device is provided and includes the following steps. A substrate is provided, and an epitaxial layer is formed on the substrate. A trench gate structure is formed in the epitaxial layer, where the trench gate structure is extended along a first direction. A body region is formed in the epitaxial layer, where the body region is adjacent to the trench gate structure. A planar gate is formed on the epitaxial layer and located directly above the body region and the trench gate structure, where the plane gate is extended along a second direction that is perpendicular to the first direction. A source region is formed in the body region. An interlayer dielectric layer is formed on the epitaxial layer and covers the plane gate. A source electrode is formed in the interlayer dielectric layer, where the source electrode is extended downward to pass through the source region and into the body region. In addition, a drain electrode is formed under the substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

FIG. 5 shows two continuous repeating units along the section line b-b in FIG. 1, and each of FIG. 6, FIG. 7 and FIG. 8 shows two continuous repeating units along both the section line a-a and the section line b-b in FIG. 1.

FIG. 10 is a schematic three-dimensional diagram of a current intensity distribution in a local area of a semiconductor device according to an embodiment of the present disclosure, where the current intensity distribution 10-1 represents the current state when only the planar gate is turned on, and the current intensity distribution 10-2 represents the current state when both the planar gate and the trench gate are turned on.

FIG. 11 is a schematic three-dimensional diagram of distributions of voltage equipotential lines in a local area of a semiconductor device according to an embodiment of the present disclosure, where a distribution 11-1 of voltage equipotential lines represents the voltage state when only the planar gate is turned on, and a distribution 11-2 of the voltage equipotential lines represents the voltage state when both the planar gate and the trench gate are turned on.

DETAILED DESCRIPTION

Figure 1:
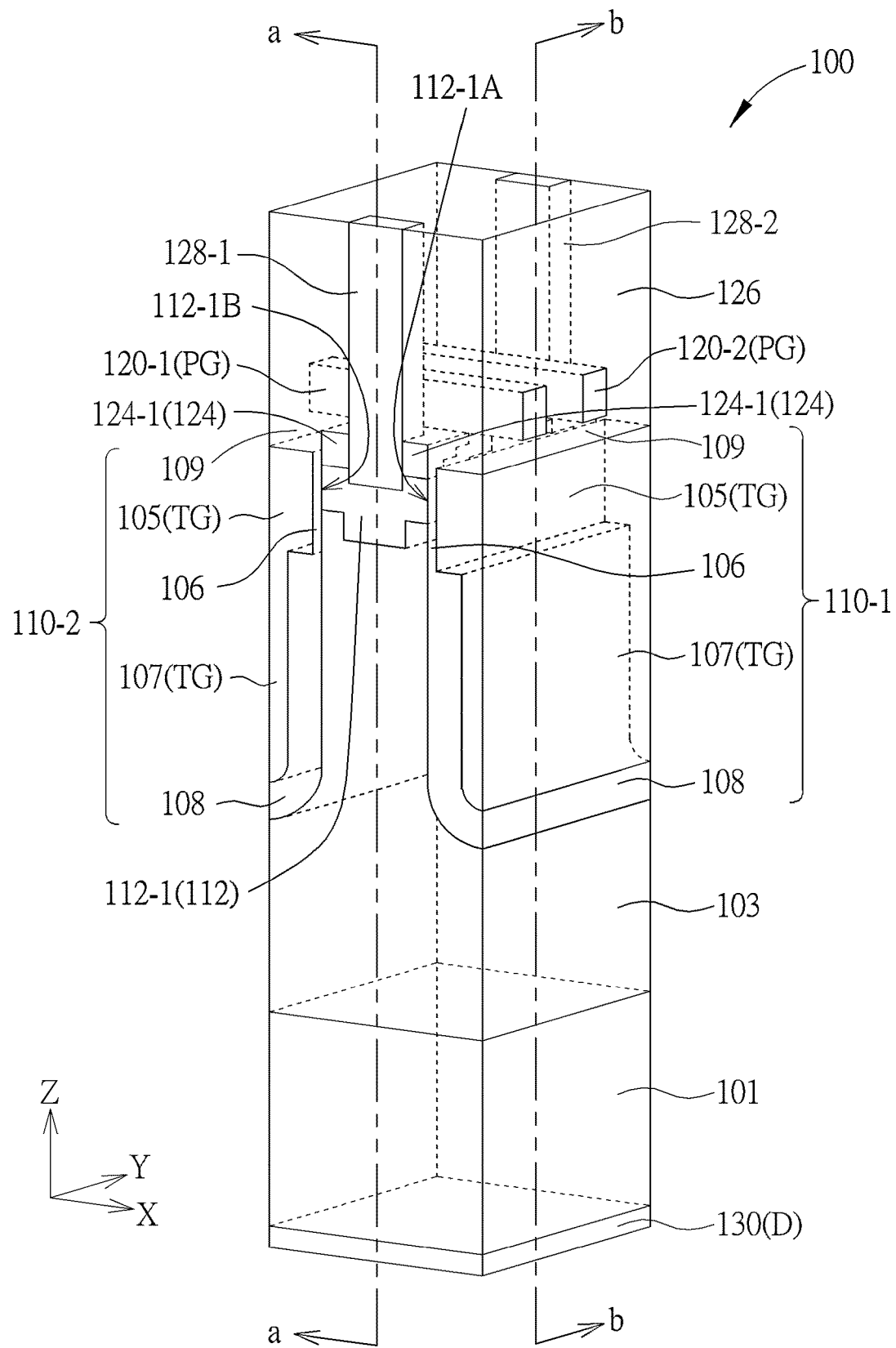
FIG. 1 is a schematic perspective view of a repeating unit of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to semiconductor devices of power transistors including a trench gate and a planar gate, which use the planar gate (PG) and the trench gate (TG) to form multiple channels, including horizontal channels and vertical channels. Moreover, when the load power is low, the planar gate is turned on to speed up the switching speed of the semiconductor devices, and when the load power is high, both the trench gate and the planar gate are turned on to further reduce the on-state resistance of the semiconductor devices. In addition, the trench gate may also provide better electric field shielding effect to redistribute the voltage of the semiconductor devices, and the planar gate may improve the control ability of process (i.e. the planar gate can be fabricated more easily) to shrink the channel length of the semiconductor devices, thereby reducing the chip area, increasing the layout density of transistors, and reducing the gate-drain charge (Qgd), the gate-drain capacitance (Cgd), the gate charge (Qg), the gate capacitance (Cg), and the on-state resistance at the same time to increase the current and reduce the switching loss of the semiconductor devices.

FIG. 1 is a schematic perspective view of a repeating unit of a semiconductor device according to an embodiment of the present disclosure. As shown in FIG. 1, in one embodiment, the semiconductor device 100 includes a substrate 101. The substrate 101 has a first conductivity type, such as an N-type heavily doped silicon substrate ($N^+$ substrate). An epitaxial layer 103 is disposed on the substrate 101 and has the first conductivity type, such as an n-type silicon epitaxial layer (N epitaxial layer). The semiconductor device 100 also includes a body region 112, such as a first body region 112-1 and a second body region (shielded and not shown in FIG. 1) disposed in the epitaxial layer 103. The body region 112 has a second conductivity type that is opposite to the first conductivity type, for example, a p-type body region (P body), where the dopant concentration of the second conductivity typed dopant in the body region 112 is higher than the dopant concentration of the first conductivity typed dopant in the epitaxial layer 103. Although the second body region is shielded and not shown in FIG. 1, as shown in FIG. 2, the second body region 112-2 is disposed apart from the first body region 112-1 along the Y-axis direction.

In addition, the semiconductor device 100 further includes a trench gate structure disposed in the epitaxial layer 103, such as a first trench gate structure 110-1 and a second trench gate structure 110-2 disposed in the epitaxial layer 103. The horizontal long axes of the two trench gate structures 110-1 and 110-2 substantially are extended along a first direction (for example, the Y-axis direction), and the second trench gate structure 110-2 is substantially parallel to the first trench gate structure 110-1. As shown in FIG. 1, along a second direction (for example, the X-axis direction), the first trench gate structure 110-1 and the second trench gate structure 110-2 are respectively located on two sides of the body region 112 (for example, they are respectively located on two sides of the first body region 112-1, and also respectively located on two sides of the second body region 112-2). The first trench gate structure 110-1 and the second trench gate structure 110-2 are both adjacent to the first body region 112-1 and the second body region 112-2. The first body region 112-1 and the second body region 112-2 are both disposed between the first trench gate structure 110-1 and the second trench gate structures 110-2. In some embodiments, each of the first trench gate structure 110-1 and the second trench gate structure 110-2 includes a first conductive portion 105, a second conductive portion 107, a first dielectric layer 106, a second dielectric layer 108 and a dielectric cap layer 109. The second conductive portion 107 is located under the first conductive portion 105. The first dielectric layer 106 is adjacent to the first conductive portion 105. The second dielectric layer 108 is adjacent to the second conductive portion 107. The dielectric cap layer 109 is located on the first conductive portion 105. In one embodiment, the first conductive portion 105 and the second conductive portion 107 may be electrically connected to each other to be collectively used as a trench gate electrode. In the second direction (for example, the X-axis direction), the width of the first conductive portion 105 is greater than the width of the second conductive portion 107, and the thickness of the first dielectric layer 106 is smaller than the thickness of the second dielectric layer 108. In some embodiments, the first conductive portion 105 and the second conductive portion 107 may be formed of polysilicon, metals, alloys, other conductive materials, or stacked layers including the aforementioned materials, where the polysilicon is such as p-type or n-type polysilicon. The first dielectric layer 106, the second dielectric layer 108 and the dielectric cap layer 109 may be formed of silicon oxide, silicon nitride, silicon oxynitride or dielectric materials with high dielectric constant. Moreover, the first dielectric layer 106, the second dielectric layers 108 and the dielectric cap layer 109 may be formed of the same material.

In addition, the semiconductor device 100 further includes a first planar gate 120-1 and a second planar gate 120-2 disposed on the epitaxial layer 103. The long axes of the two planar gates 120-1 and 120-2 substantially are extended along the second direction (for example, the X-axis direction). There is a non-zero included angle between the second direction and the first direction, and the non-zero included angle is, for example, 90 degrees, i.e., the second direction may be perpendicular to the first direction. The second planar gate 120-2 is preferably substantially parallel to the first planar gate 120-1, where the first planar gate 120-1 is at least partially located directly above the first body region 112-1, and the second planar gate 120-2 is at least partially located directly above the second body region 112-2. Moreover, the dielectric cap layer 109 corresponding to the first trench gate structure 110-1 is at least partially disposed between the first planar gate 120-1 and the first conductive portion 105 of the first trench gate structure 110-1, and between the second planar gate 120-2 and the first conductive portion 105 of the first trench gate structure 110-1. The dielectric cap layer 109 corresponding to the second trench gate structure 110-2 is at least partially disposed between the first planar gate 120-1 and the first conductive portion 105 of the second trench gate structure 110-2, and between the second planar gate 120-2 and the first conductive portion 105 of the second trench gate structure 110-2. Accordingly, the first planar gate 120-1 and the second planar gate 120-2 are separated from the corresponding first conductive portions 105 in the vertical direction (for example, the Z-axis direction). In some embodiments, the first planar gate 120-1 and the second planar gate 120-2 may be formed of polysilicon, metals, alloys, other conductive materials, or stacked layers including the aforementioned materials, where the polysilicon is such as p-type or n-type polysilicon. In some embodiments, the conductivity type of the polysilicon of the first planar gate 120-1 and the second planar gate 120-2 is the same as the conductivity type of the polysilicon conductive portions of the first trench gate structure 110-1 and the second trench gate structure 110-2. In some other embodiments, the conductivity type of the polysilicon of the first planar gate 120-1 and the second planar gate 120-2 is opposite to the conductivity type of the polysilicon conductive portions of the first trench gate structure 110-1 and the second trench gate structure 110-2. In some embodiments, the respective conductivity types of the polysilicon of the first planar gate 120-1, the second planar gate 120-2, the first trench gate structure 110-1, and the second trench gate structure 110-2 may be determined independently according to the actual requirements of the semiconductor devices.

Figure 2:
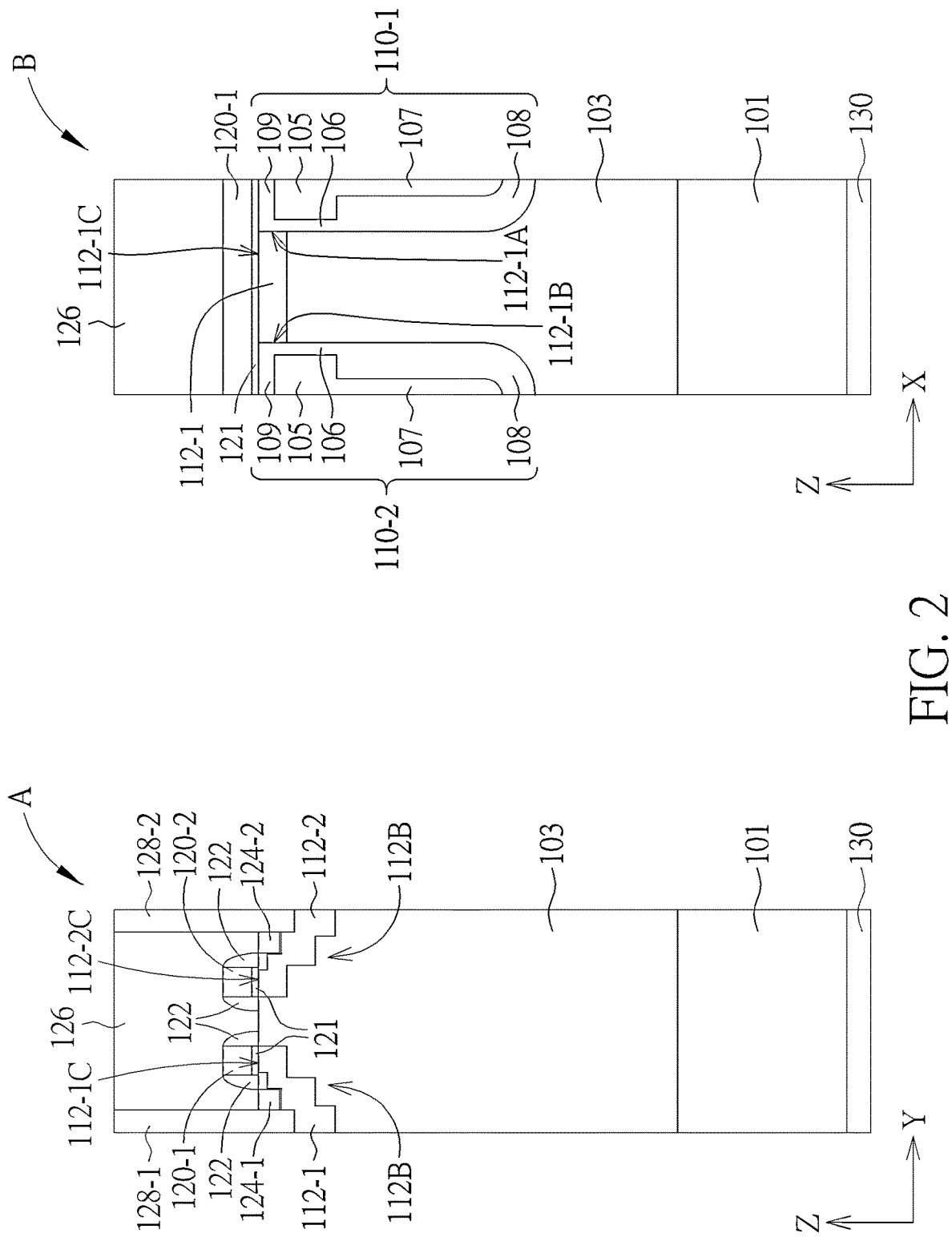
FIG. 2 is a schematic cross-sectional view of a repeating unit of a semiconductor device according to an embodiment of the present disclosure, where the section A is taken along the section line a-a in FIG. 1, and the section B is taken along the section line b-b in FIG. 1.

Still referring to FIG. 1 and FIG. 2, the semiconductor device 100 further includes a first source electrode 128-1 and a second source electrode 128-2 disposed on the epitaxial layer 103 and formed in an interlayer dielectric layer (ILD) 126. The first source electrode 128-1 and the second source electrode 128-2 are extended downward into the first body region 112-1 and the second body region 112-2, respectively. As shown in FIG. 1, both the first planar gate 120-1 and the second planar gate 120-2 are disposed between the first source electrode 128-1 and the second source electrode 128-2. The extension direction of the first planar gate 120-1 and the second planar gate 120-2 may be substantially parallel to the surface of the substrate 101. The extension direction of the first source electrode 128-1 and the second source electrode 128-2 may be substantially perpendicular to the surface of the substrate 101. In addition, the semiconductor device 100 further includes a source region 124 such as a first source region 124-1 disposed in the first body region 112-1 and at least partially adjacent to and electrically coupled to the first source electrode 128-1. For example, the first source region 124-1 may surround the bottom portion of the first source electrode 128-1. Moreover, although a second source region is not shown in FIG. 1, the second source region is disposed in the second body region. The second source region is at least partially adjacent to or surrounds the second source electrode 128-2, thereby being electrically coupled to the bottom portion of the second source electrode 128-2. In some embodiments, the first source region 124-1 and the second source region have the first conductivity type, such as an n-type heavily doped region, and the dopant concentration of the source region 124 is higher than the dopant concentration of the epitaxial layer 103. In addition, the semiconductor device 100 further includes a drain electrode 130 disposed under the substrate 101. The composition of the drain electrode 130 may include metal or other conductive materials, and the drain electrode 130 is formed on the bottom surface of the substrate 101.

As shown in FIG. 1 and FIG. 2, the first direction (for example, the Y-axis direction) and the vertical direction (for example, the Z-axis direction) define a Y-Z plane, and the first direction and the second direction (for example, the X-axis direction) define an X-Y plane. In a direction substantially parallel to the Y-Z plane, the first body region 112-1 has opposite first Y-Z direction side surface 112-1A and second Y-Z direction side surface 112-1B. Similarly, in the direction substantially parallel to the Y-Z plane, the second body region 112-2 has opposite third Y-Z direction side surface and fourth Y-Z direction side surface. The aforementioned first, second, third and fourth Y-Z direction side surfaces are all flat Y-Z direction side surfaces. Moreover, the first trench gate structure 110-1 is adjacent to the first Y-Z direction side surface 112-1A of the first body region 112-1 and the third Y-Z direction side surface of the second body region. The second trench gate structure 110-2 is adjacent to the second Y-Z direction side surface 112-1B of the first body region 112-1 and the fourth Y-Z direction side surface of the second body region. Referring to FIG. 1 and FIG. 2, the first body region 112-1 has an X-Y direction top surface 112-1C along the X-Y plane, and the first planar gate 120-1 is at least partially located directly above the X-Y direction top surface 112-1C of the first body region 112-1. In addition, the second body region also has an X-Y direction top surface 112-2C along the X-Y plane, and the second planar gate 120-2 is at least partially located directly above the X-Y direction top surface 112-2C of the second body region. In addition, the first source region 124-1 surrounds the bottom portion of the first source electrode 128-1 along the X-Y plane, and the second source region surrounds the bottom portion of the second source electrode 128-2 along the X-Y plane.

FIG. 2 is a schematic cross-sectional view of a repeating unit of a semiconductor device according to an embodiment of the present disclosure, where the section A is a Y-Z plane taken along the section line a-a in FIG. 1, and the section B is an X-Z plane taken along the section line b-b in FIG. 1. Please refer to FIG. 1, the section A of FIG. 2, and FIG. 6 together, in the direction substantially parallel to the X-Y plane, the first body region 112-1 has a first body central region 112C and a first body peripheral region 112D. The first source region 124-1 is adjacent to the first body central region 112C. The first planar gate 120-1 is extended along the second direction (for example, the X-axis direction) and sequentially across over the first trench gate structure 110-1, the first body peripheral region 112D and the second trench gate structure 110-2. In addition, the first source electrode 128-1 is extended downward along the vertical direction (for example, the Z-axis direction) and toward the first body central region 112C. In the direction of X-Y plane, the first source region 124-1 surrounds the bottom portion of the first source electrode 128-1. Similarly, in the direction substantially parallel to the X-Y plane, the second body region 112-2 has a second body central region 112E and a second body peripheral region 112F. The second source region 124-2 is adjacent to the second body central region 112E. The second planar gate 120-2 is extended along the second direction (for example, the X-axis direction) and sequentially across over the first trench gate structure 110-1, the second body peripheral region 112F and the second trench gate structure 110-2. In addition, the second source electrode 128-2 is extended downward along the vertical direction and toward the second body central region 112E. In the direction of X-Y plane, the second source region 124-2 surrounds the bottom portion of the second source electrode 128-2.

Figure 6:
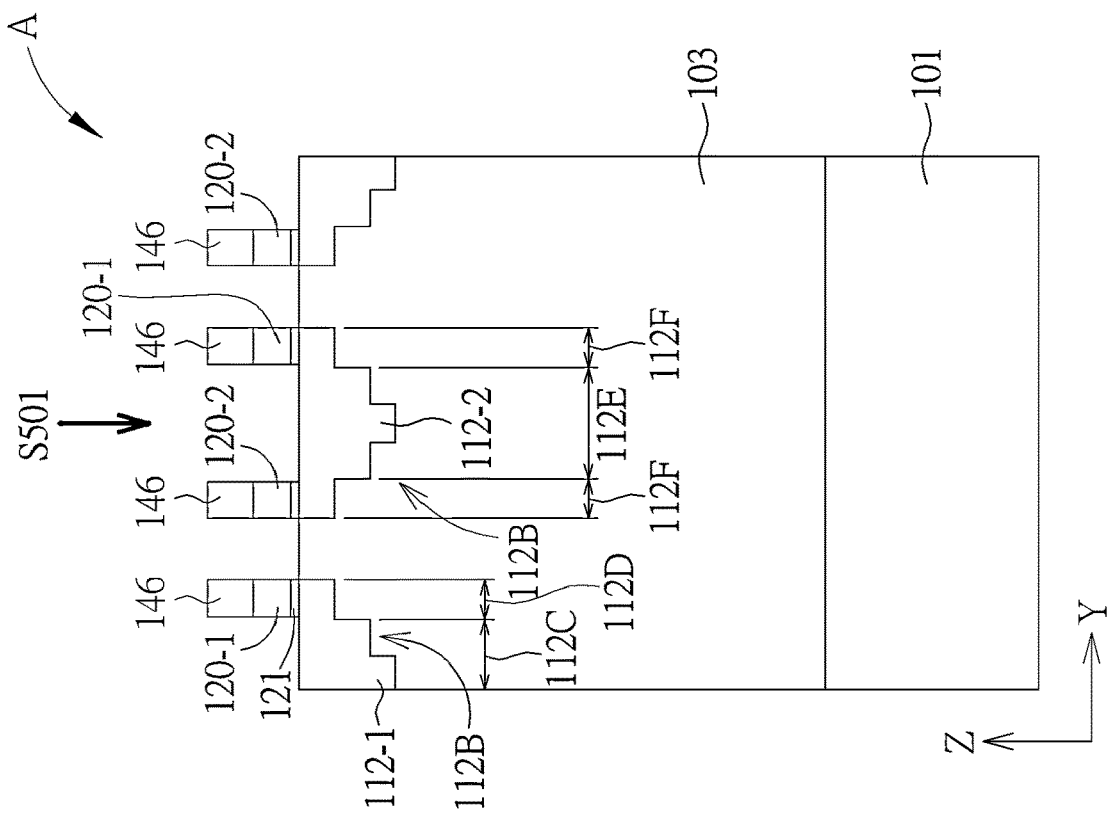
Figure 6:
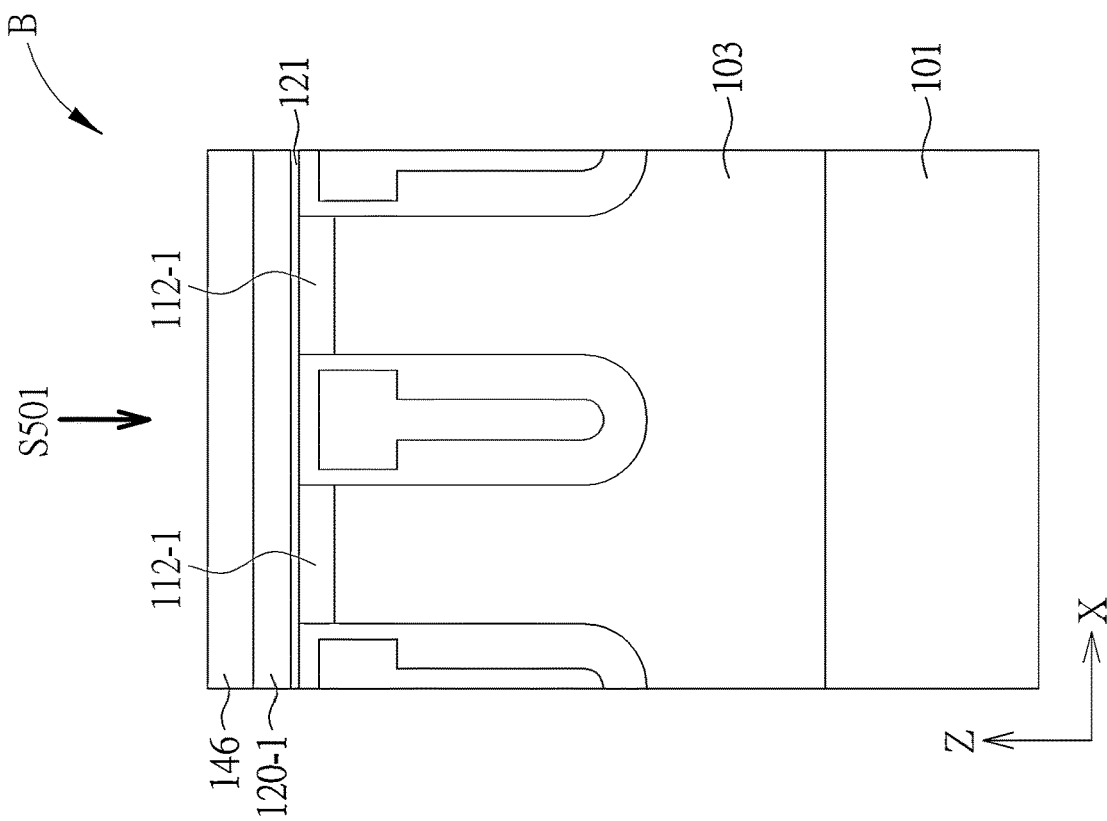

As shown in the section A of FIG. 2 and FIG. 6, the semiconductor device further includes a dielectric layer 121 disposed between the first planar gate 120-1 and the first body peripheral region 112D of the first body region 112-1, and between the second planar gate 120-2 and the second body peripheral region 112F of the second body region 112-2. In addition, as shown in the section B of FIG. 2, in the second direction (for example, the X-axis direction), the thickness of the first dielectric layer 106 of each of the first trench gate structure 110-1 and the second trench gate structure 110-2 is smaller than the thickness of the second dielectric layer 108 thereof, and the width of the first conductive portion 105 of each of the first trench gate structure 110-1 and the second trench gate structure 110-2 is larger than the width of the conductive portion 107 thereof.

Referring to the section A of FIG. 2 again, on the Y-Z plane, the position of the first plane gate 120-1 is higher than the position of the first source region 124-1. The bottom surface 112B of the first body region 112-1 is gradually descended and extended from the first plane gate 120-1 toward the bottom portion of the first source electrode 128-1. In some embodiments, the bottom surface 112B of the first body region 112-1 is a multi-step or multi-arc shaped bottom surface, and the multi-step or multi-arc shaped bottom surface is gradually descended in the direction from the first planar gate 120-1 to the bottom portion of the first source electrode 128-1. Similarly, the bottom surface of the second planar gate 120-1 is higher than the top surface of the second source region 124-2. The bottom surface 112B of the second body region 112-2 is gradually descended and extended from the second planar gate 120-2 toward the bottom portion of the second source electrode 128-2. In some embodiments, the bottom surface 112B of the second body region 112-2 is a multi-step or multi-arc shaped bottom surface, and the multi-step or multi-arc shaped bottom surface is gradually descended in the direction from the second planar gate 120-2 to the bottom portion of the second source electrode 128-2.

Figure 3:
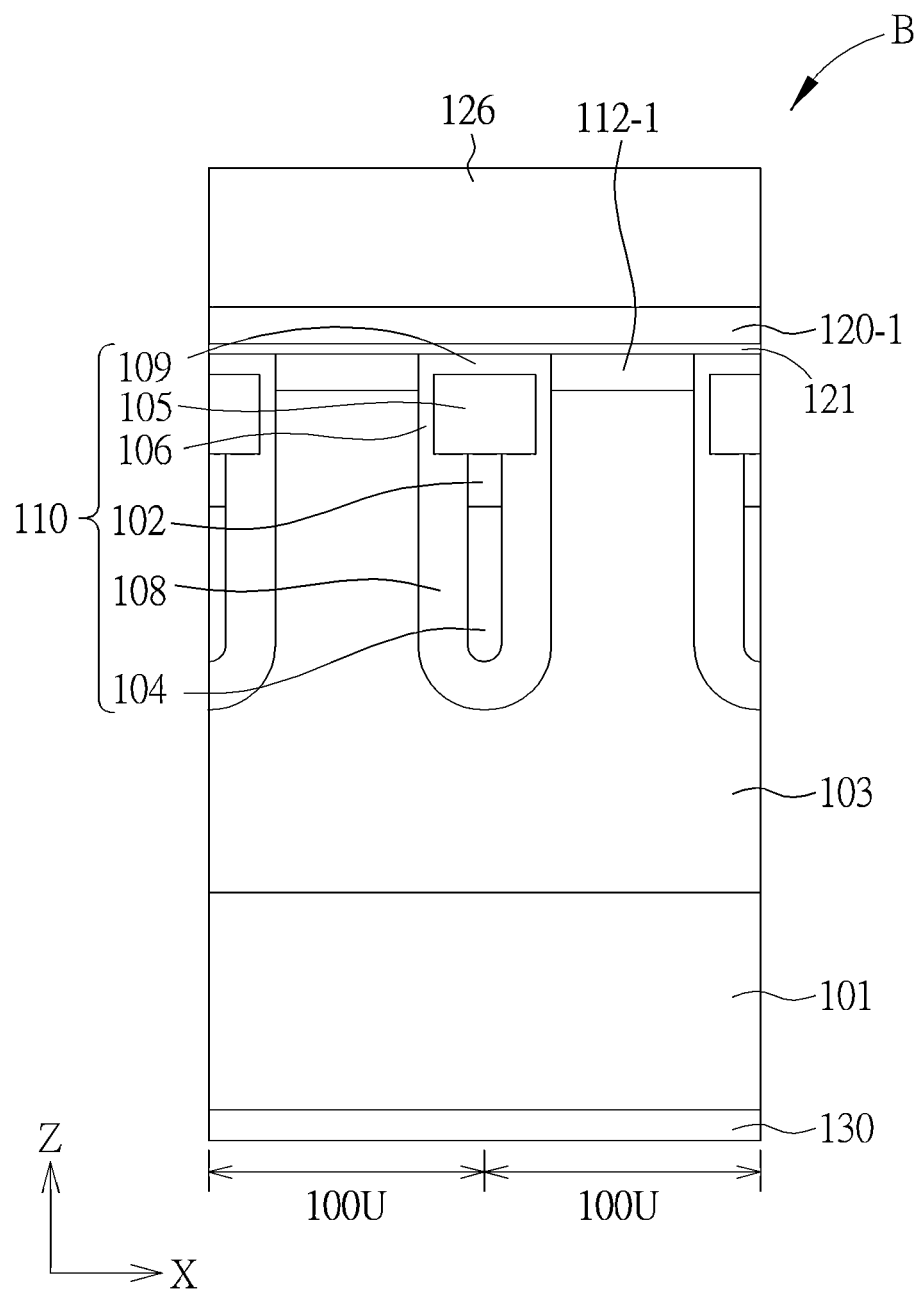
FIG. 3 is a schematic cross-sectional view of two continuous repeating units of a semiconductor device according to another embodiment of the present disclosure, where the position of the section line of FIG. 3 is the same as the section line b-b in FIG. 1.

FIG. 3 is a schematic cross-sectional view of two continuous repeating units 100U of a semiconductor device according to another embodiment of the present disclosure, and the position of the section line of DIF. 3 is the same as that of the section line b-b in FIG. 1. As shown in FIG. 3, in one embodiment, each trench gate structure 110 of the semiconductor device includes a first conductive portion 105, a field plate (FP) 104, a first dielectric layer 106, a second dielectric layer 108, a middle dielectric portion 102 and a dielectric cap layer 109. The field plate 104 is located under the first conductive portion 105, and the middle dielectric portion 102 is located between the first conductive portion 105 and the field plate 104, such that the first conductive portion 105 and the field plate 104 are separated from each other in a vertical direction (for example, the Z-axis direction). The field plate 104 receives charges from one of the source electrode and the first conductive portion of the trench gate structure to determine the potential of the field plate 104. For example, the field plate 104, the middle dielectric portion 102, and the first conductive portion 105 may construct a capacitor structure. When a voltage is applied to the first conductive portion 105, the potential of the field plate 104 may be affected thereby. In addition, the first dielectric layer 106 surrounds the first conductive portion 105, the second dielectric layer 108 surrounds the field plate 104 and the middle dielectric portion 102, and the dielectric cap layer 109 is located on the first conductive portion 105. Through using the field plate 104, the electric field distribution in the epitaxial layer 103 around the trench gate structure 110 may be regulated to distribute the voltage, thereby improving the breakdown voltage of the semiconductor device.

Figure 4:
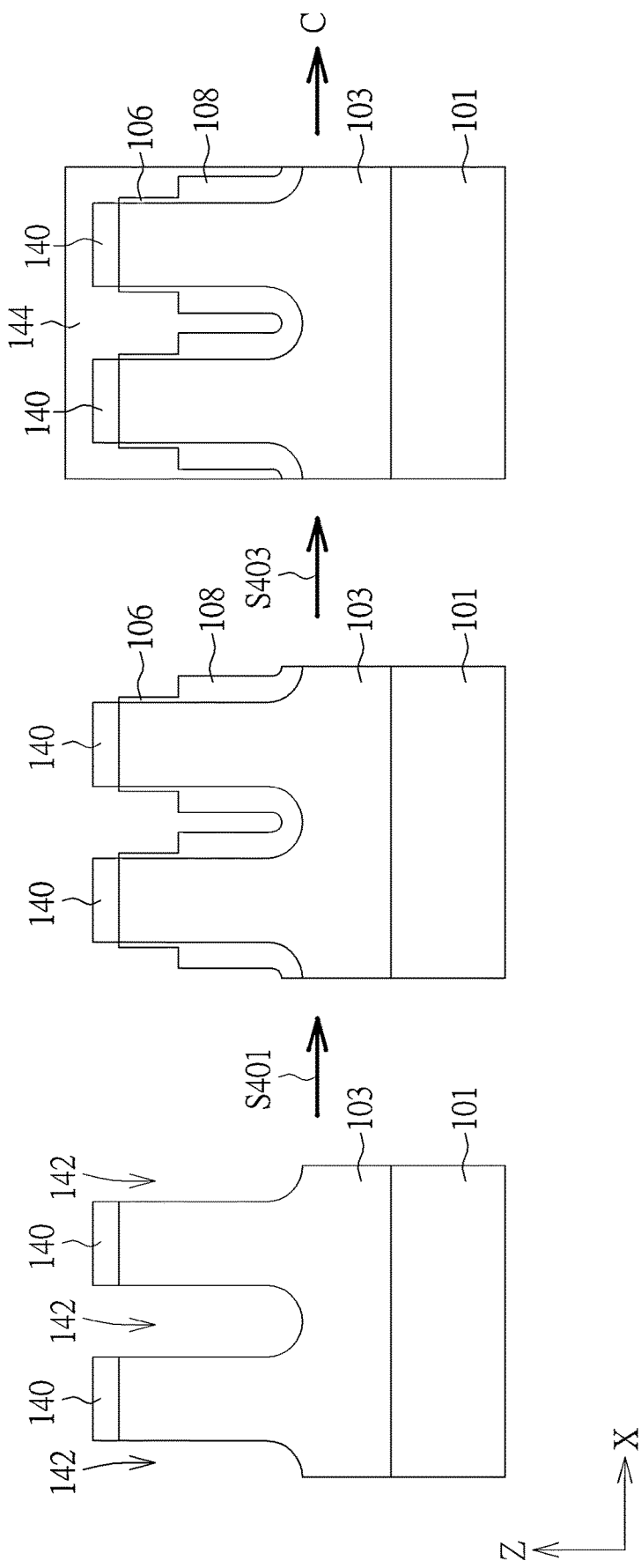
FIG. 4, FIG. 5, FIG. 6, FIG. 7 and FIG. 8 are schematic cross-sectional views of various stages of a method of fabricating a semiconductor device according to an embodiment of the present disclosure, where each of FIG. 4
Figure 5:
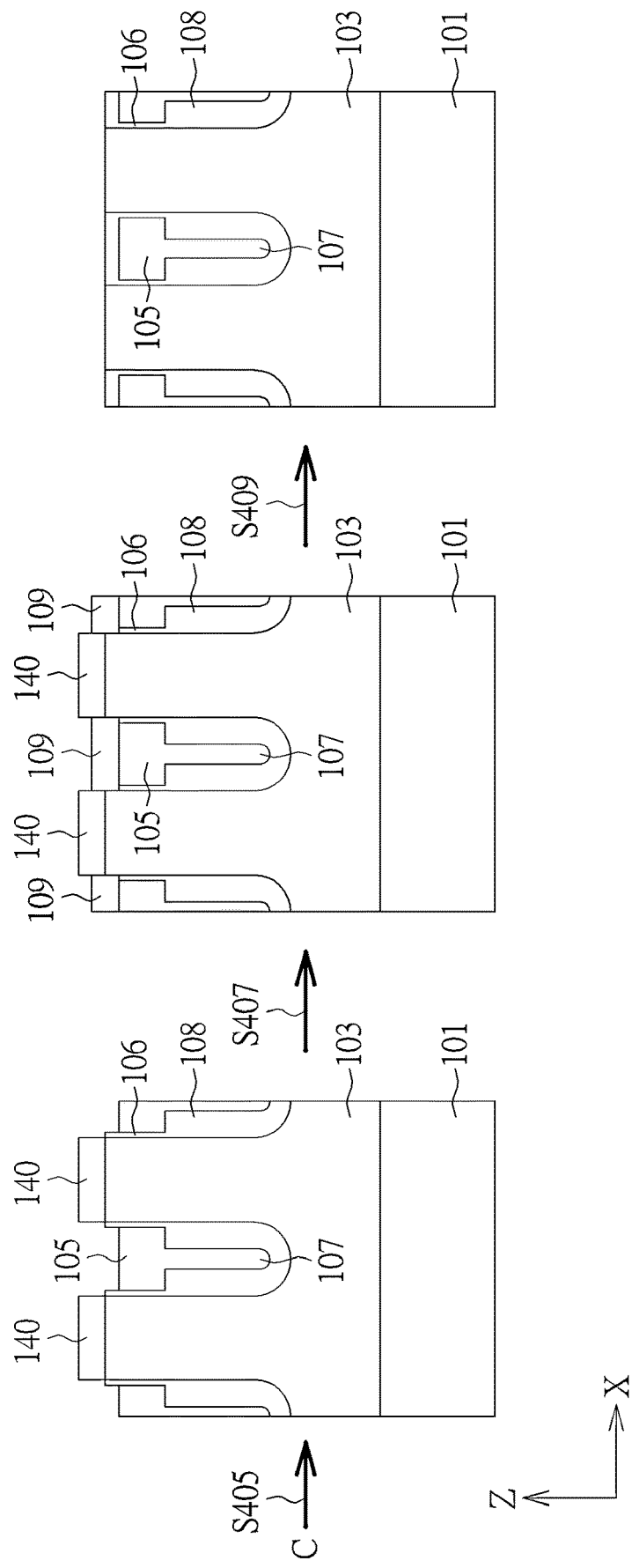
Figure 7:
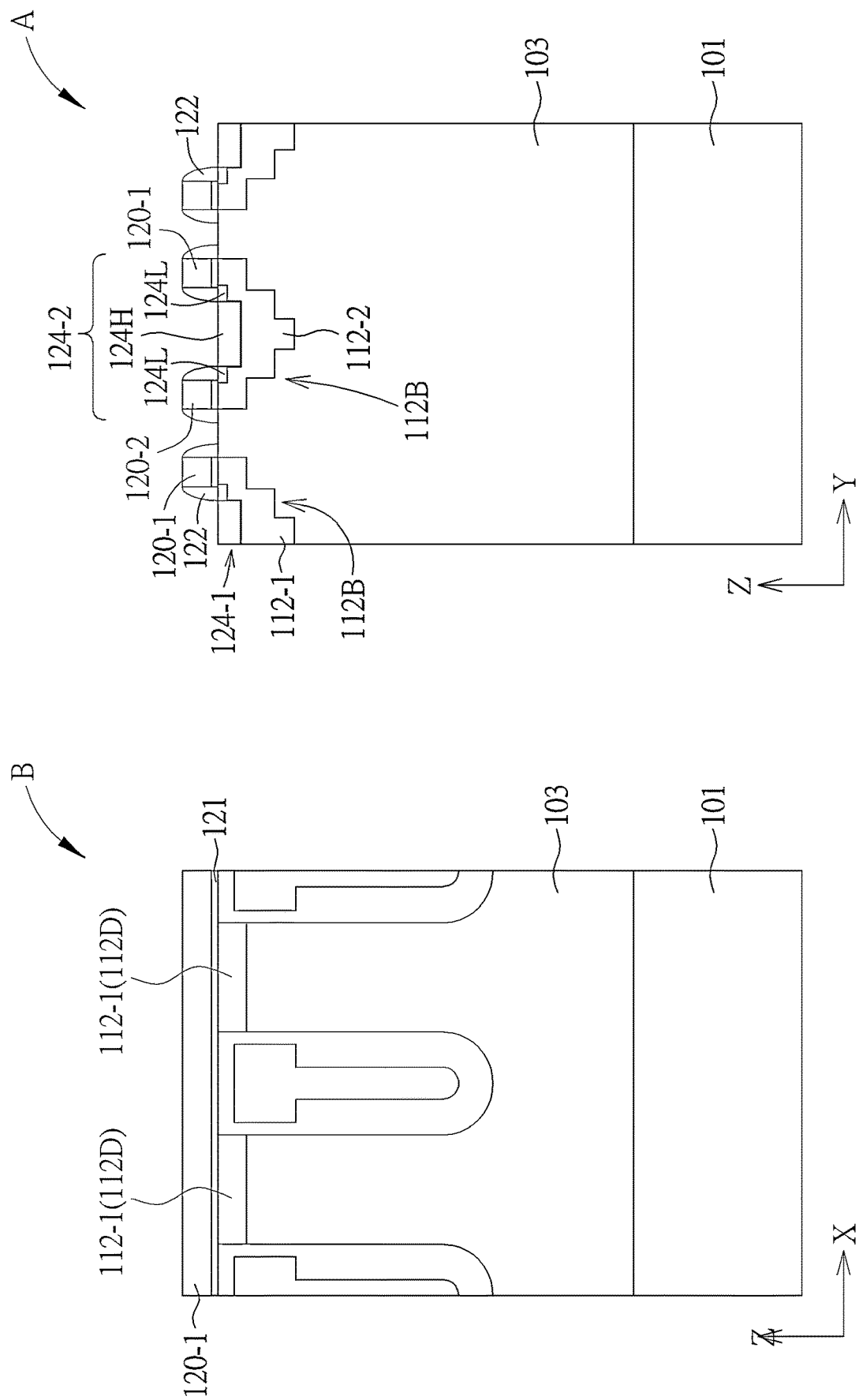
Figure 8:
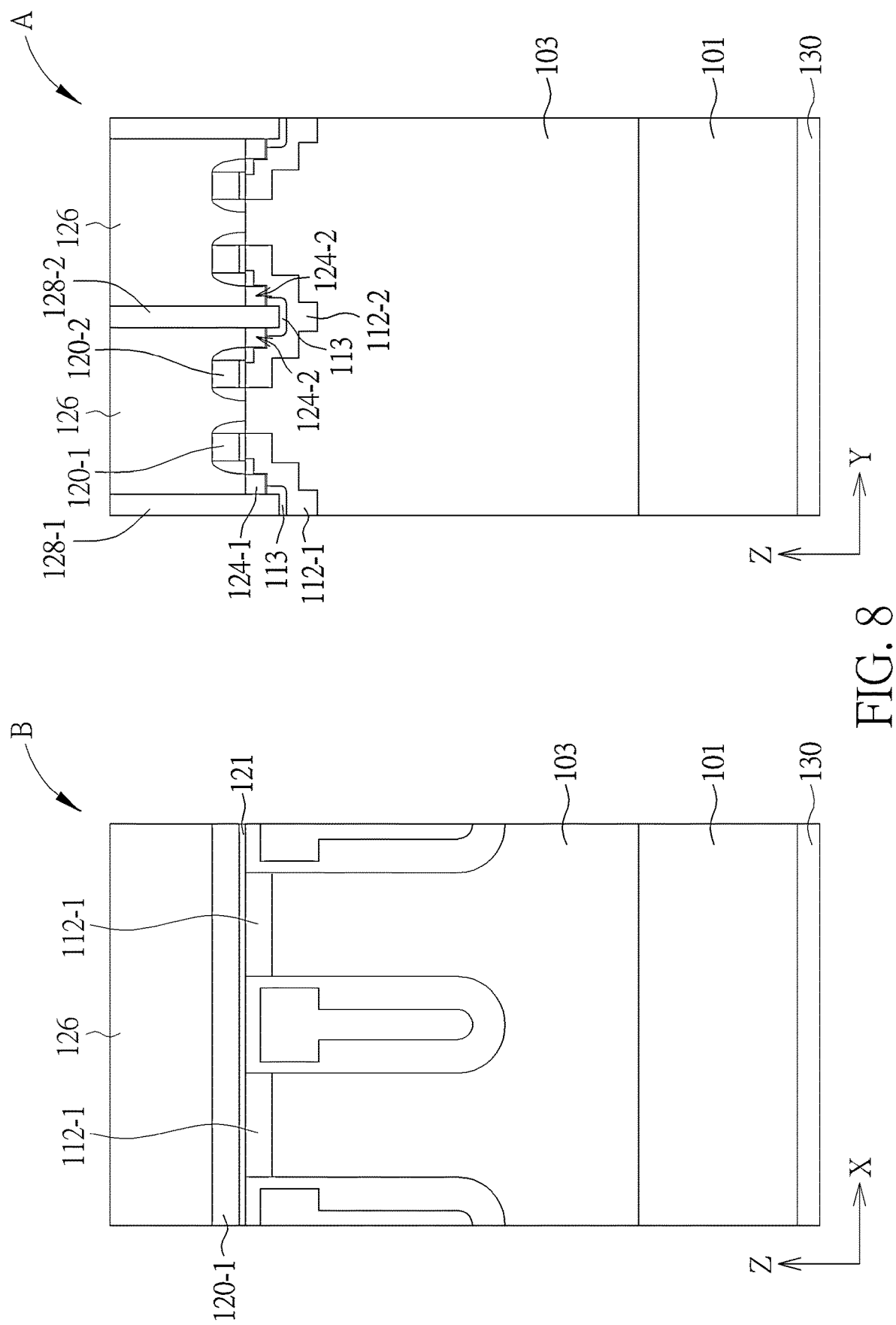

FIG. 4, FIG. 5, FIG. 6, FIG. 7 and FIG. 8 are schematic cross-sectional views of various stages of a method of fabricating a semiconductor device according to an embodiment of the present disclosure, where each of FIG. 4 and FIG. 5 shows two continuous repeating units along the section line b-b in FIG. 1, and each of FIG. 6, FIG. 7 and FIG. 8 shows two continuous repeating units along both the section line a-a and the section line b-b in FIG. 1. Referring to FIG. 4, firstly, a substrate 101 is provided, and an epitaxial layer 103 is formed on the substrate 101. A patterned mask 140 is formed on the epitaxial layer 103, and then multiple trenches 142 are formed in the epitaxial layer 103 by an etching process through the openings of the patterned mask 140. Next, at step S401, a first dielectric layer 106 and a second dielectric layer 108 are formed in each trench 142, where the second dielectric layer 108 is located under the first dielectric layer 106, and the thickness of the second dielectric layer 108 is greater than the thickness of the first dielectric layer 106. The second dielectric layer 108 is lined on the bottom surface and the lower sidewall of the trench 142, and the first dielectric layer 106 is lined on the upper sidewall of the trench 142. The first dielectric layer 106 and the second dielectric layer 108 may be formed by deposition and etching processes. Then, at step S403, a conductive layer 144 is deposited to fill up the remaining space of each trench 142 and cover the patterned mask 140. In some embodiments, the conductive layer 144 is n-type or p-type polysilicon, metal or other conductive materials, and the conductive layer 144 may be deposited by chemical vapor deposition (CVD) or physical vapor deposition (PVD) process.

Next, referring to FIG. 5, at step S405, the conductive layer 144 is etched back, so that the top surface of the remaining portion of the conductive layer 144 is slightly lower than the top surface of the epitaxial layer 103 to form a first conductive portion 105 and a second conductive portion 107 in each trench 142. The second conductive portion 107 is located under the first conductive portion 105, and in the second direction (for example, the X-axis direction), the width of the first conductive portion 105 is greater than the width of the second conductive portion 107. The first dielectric layer 106 surrounds the first conductive portion 105, and the second dielectric layer 108 surrounds the second conductive portion 107. In one embodiment, the first conductive portion 105 and the second conductive portion 107 are connected to each other to be collectively used as a trench gate electrode. In another embodiment, as shown in FIG. 3, the first conductive portion 105 and the field plate 104 located thereunder may be formed in the trench and separated from each other. The first conductive portion 105 is used as the trench gate electrode. The first conductive portion 105, the field plate 104, and the middle dielectric portion 102 there-between may be formed respectively by multiple deposition processes.

Still referring to FIG. 5, at step S407, a dielectric material is deposited on the first conductive portion 105 to form a dielectric cap layer 109. In some embodiments, the top surface of the dielectric cap layer 109 is level with or slightly higher than the top surface of the epitaxial layer 103. The first conductive portion 105, the second conductive portion 107, the first dielectric layer 106, the second dielectric layer 108 and the dielectric cap layer 109 formed by the aforementioned steps constitute each trench gate structure, such as the first trench gate structure 110-1 and the second trench gate structure 110-2 as shown in FIG. 1 and the section B of FIG. 2. Next, at step S409, the patterned mask 140 is removed to expose the surface of the epitaxial layer 103 where body regions will be subsequently formed.

Thereafter, referring to the section A and the section B of FIG. 6, firstly, a dielectric layer 121 and a material layer of planar gates are sequentially deposited on the epitaxial layer 103, and then a patterned hard mask 146 is formed on the material layer of planar gates. The patterned hard mask 146 is used as an etching mask, and the dielectric layer 121 and the material layer of planar gates are patterned by an etching process to form a first planar gate 120-1, a second planar gate 120-2 and the dielectric layer 121 under these planar gates as shown in the section A of FIG. 6. Each planar gate is extended along the second direction (for example, the X-axis direction) and across over each trench gate structure. Still referring to the section A of FIG. 6, in one embodiment, the first planar gate 120-1, the second planar gate 120-2 and a patterned photoresist (not shown in FIG. 6) are used as the mask of an ion implantation process, where the patterned photoresist shields the separate areas between the subsequently formed body regions. The body regions are formed in the epitaxial layer 103 by using multiple ion implantation processes S501. These ion implantation processes S501 are performed by using different implantation energies respectively, and implanting ions of the same conductivity type into the epitaxial layer 103. The ion implantation process of lower implantation energy may be performed by using oblique angle to implant ions to form portions of the body region with a higher bottom surface, such as the body peripheral regions 112D and 112F directly under the planar gates. The other ion implantation process of higher implantation energy may be used to form other portions of the body region with a lower bottom surface, such as the body central regions 112C and 112E, so that the bottom surface 112B of each body region has a multi-step shape, such as the bottom surfaces 112B of the first body region 112-1 and the second body region 112-2 as shown in the section A of FIG. 6, which are multi-step shaped bottom surfaces. Moreover, if a heat treatment is included in the subsequent processes, the multi-step shaped bottom surface may be changed into a multi-arc shaped bottom surface by thermal diffusion.

Next, referring to the section A and the section B of FIG. 7, the patterned hard mask 146 on each planar gate is removed, and spacers 122 may be formed on the sidewalls of each planar gate. Still referring to the section A of FIG. 7, a source region is formed in each body region by an ion implantation process, such as a first source region 124-1 in the first body region 112-1 and a second source region 124-2 in the second body region 112-2, where the conductivity type of the source region is opposite to the conductivity type of the body region. For example, an n-type source region is formed in a p-type body region. In one embodiment, firstly, a lightly doped region of each source region is formed by using an ion implantation process of a lower doping concentration and with oblique angle, such as a lightly doped region 124L of the second source region 124-2 as shown in the section A of FIG. 7. The lightly doped region 124L is located directly below the spacers 122 of the planar gate and in the body region. Afterwards, a heavily doped region of each source region is formed by using an ion implantation process of a higher doping concentration, such as a heavily doped region 124H of the second source region 124-2 as shown in the section A of FIG. 7, which is formed in the body region between the first planar gate 120-1 and the second planar gate 120-2.

Thereafter, referring to the section A and the section B of FIG. 8, an interlayer dielectric (ILD) layer 126 is formed on the epitaxial layer 103 and covers each planar gate and each source region, for example, covers the first planar gate 120-1, the second planar gate 120-2, the first source region 124-1 and the second source region 124-2. Still referring to the section A of FIG. 8, the ILD layer 126, the source region and the body region are etched to form openings for source electrodes, where the openings pass through the ILD layer 126, the source region and the body region. Then, a heavily doped region 113 is formed in the body region by an ion implantation process through the opening for source electrode. The conductivity type of the heavily doped region 113 is the same as the conductivity type of the body region, for example a p-type heavily doped region ($P^+$ region). Afterwards, the openings for source electrodes are filled up by a conductive material to form source electrodes, such as a first source electrode 128-1 and a second source electrode 128-2. Each source electrode is extended downward to pass through the source region and into the body region, and the heavily doped region 113 is located directly under each source electrode. Then, a drain electrode 130 is formed on the bottom surface of the substrate 101. The drain electrode 130 may be formed by deposition and etching processes and the drain electrode 130 may be formed of metal or other conductive materials.

Figure 9:
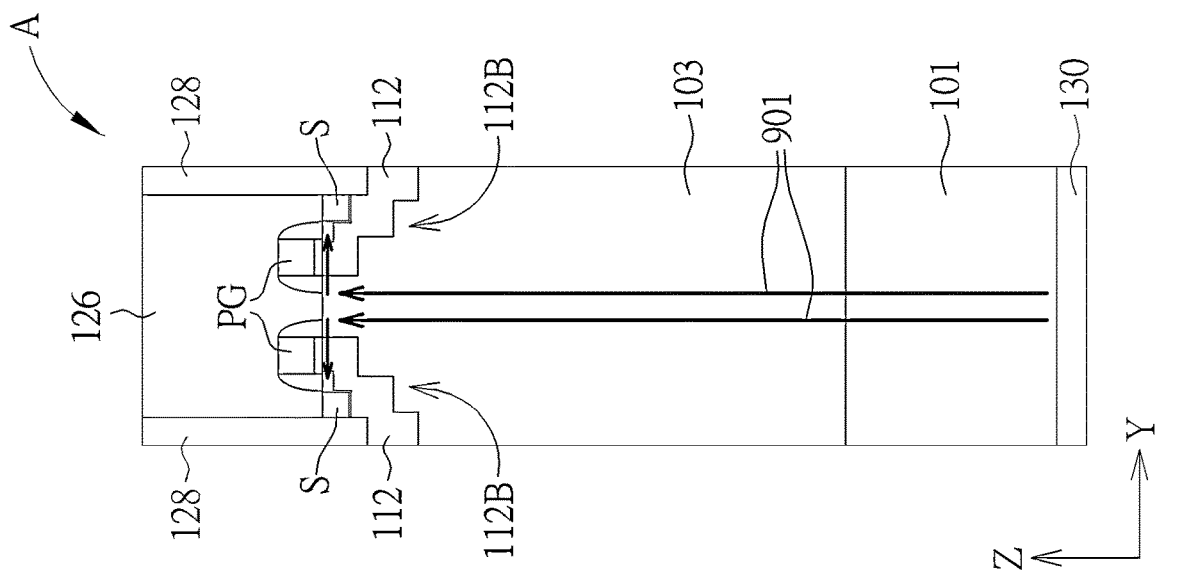
FIG. 9 is a schematic diagram of a current path of one repeating unit of a semiconductor device according to an embodiment of the present disclosure, where the section A shows a current path controlled by a planar gate along the section line a-a in FIG. 1, and the section B shows a current path controlled by a trench gate along the section line b-b in FIG. 1.
Figure 9:
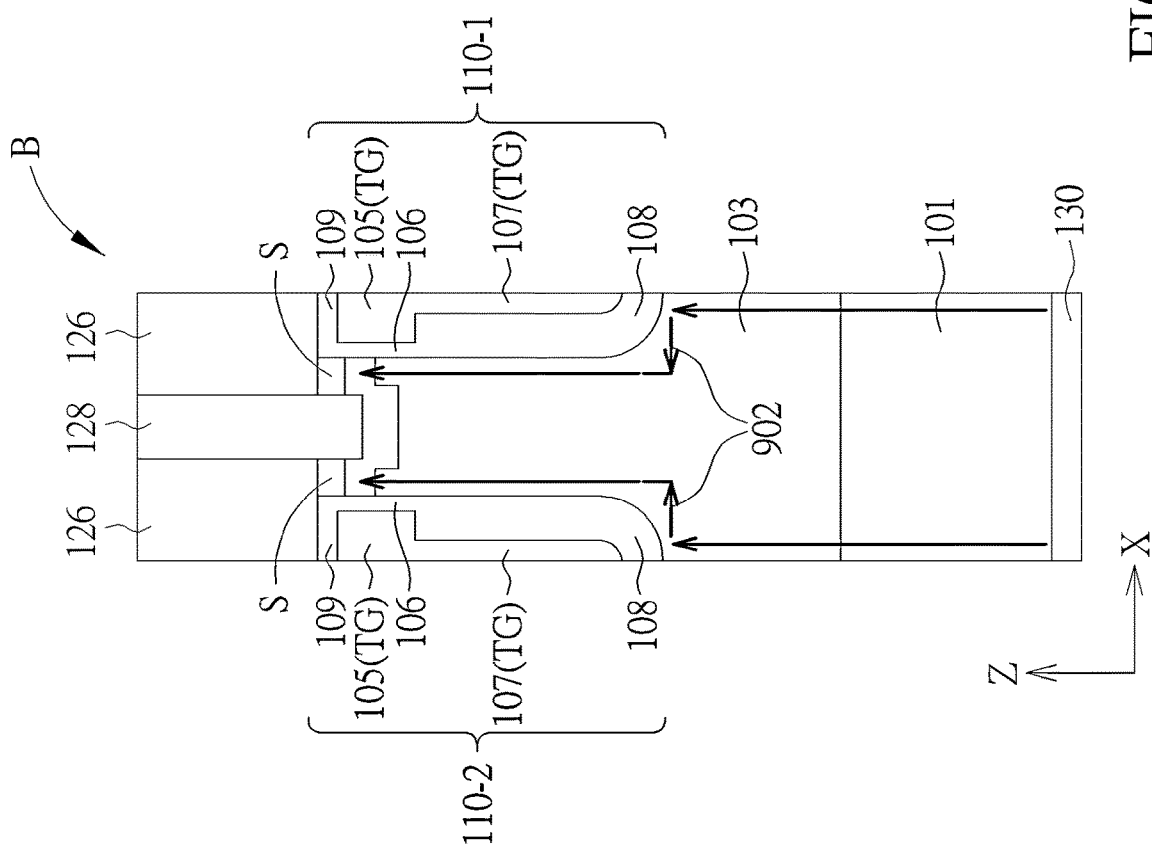

FIG. 9 is a schematic diagram of a current path of one repeating unit of a semiconductor device according to an embodiment of the present disclosure, where the section A taken along the section line a-a in FIG. 1 shows a current path 901 controlled by the planar gate (PG), and the section B taken along the section line b-b in FIG. 1 shows a current path 902 controlled by the trench gate (TG). The directions of current flow of the current path 901 and the current path 902 are indicated by arrow segments. As shown in the section A of FIG. 9, when the planar gate (PG) is turned on (on-state), the current path 901 shows current flowing upward from the drain electrode D, passing through the substrate 101 and the epitaxial layer 103, then flowing through the carrier channel under the planar gate (PG) (located on the top surface of the body region 112) toward the source region S, and finally flowing into the source electrode 128.

As shown in the section B of FIG. 9, when the trench gate (TG) is turned on, the current path 902 shows current flowing upward from the drain electrode D, passing through the substrate 101 and the epitaxial layer 103, flowing along the bottom surfaces and upward along the sidewalls of the trench gate structures 110-1 and 110-2 for flowing through the carrier channel adjacent to the first conductive portion 105 and the second conductive portion 107 (located on the side of the body region 112) toward the source region S, and finally flowing into the source electrode 128.

Figure 10:
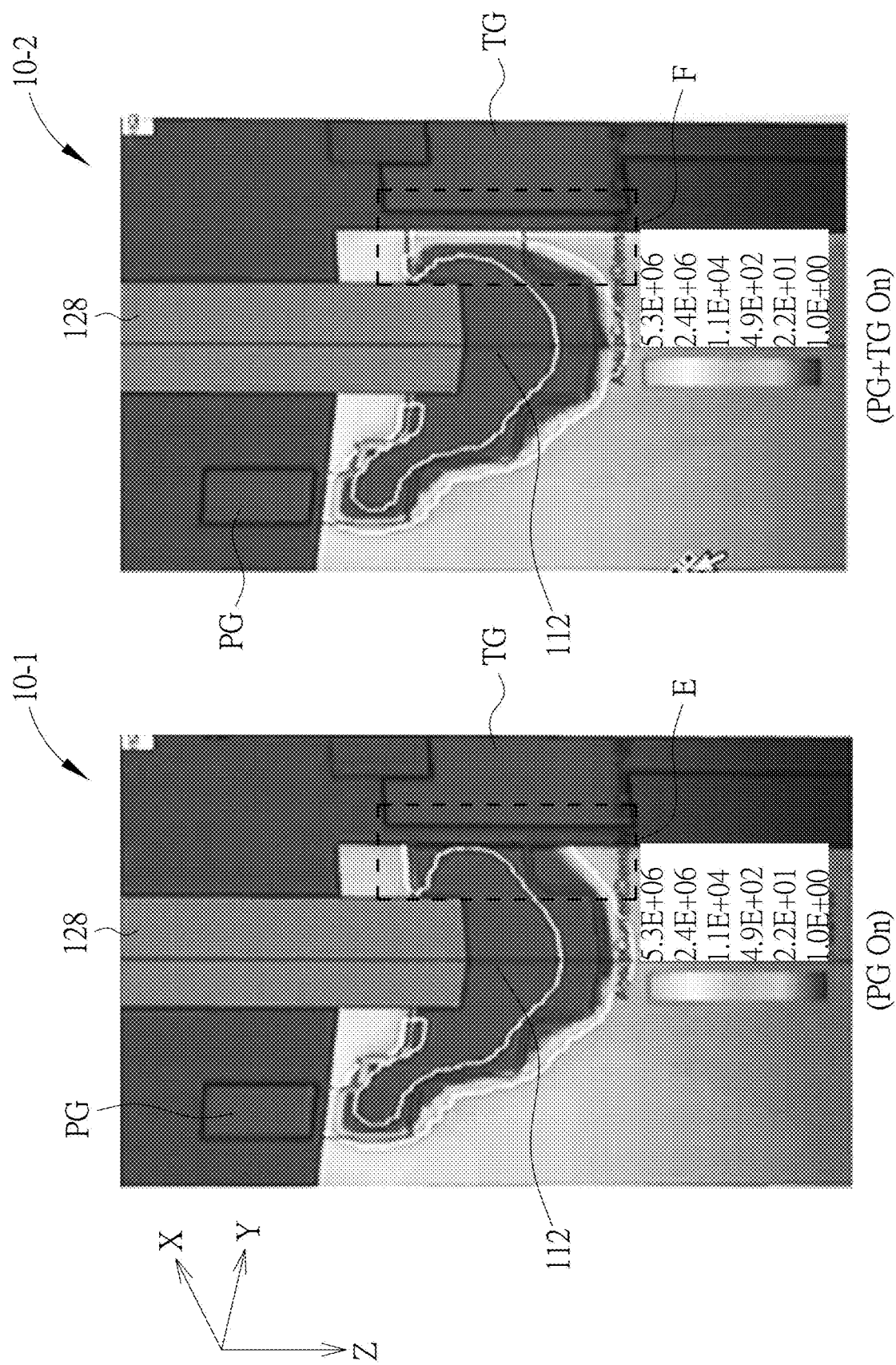

FIG. 10 is a schematic three-dimensional diagram of a current intensity distribution in a local area of a semiconductor device according to an embodiment of the present disclosure, where a current intensity distribution 10-1 represents the current state when only the planar gate is turned on (PG On), and a current intensity distribution 10-2 represents the current state when both the planar gate and the trench gate are turned on (PG+TG On). Through comparing an area E of the current intensity distribution 10-1 and an area F of the current intensity distribution 10-2 in FIG. 10, it shows that when the planar gate and the trench gate are applied with a turn-on voltage to make both the corresponding carrier channels thereof are on-state (PG+TG On), the current intensity (for example, about 4.9E+02 to 1.1E+04 ampere (A)) of a semiconductor region in the area F adjacent to the trench gate (TG) is greater than the current intensity (for example, about 1.0E+00A) of a semiconductor region in the area E adjacent to the trench gate (TG) where only the planar gate is turned on (PG On). It means that when the planar gate and the trench gate of the embodiments of the present disclosure are both turned on, the current intensity of the semiconductor devices is significantly increased, which is beneficial to the application of high-power transistors.

Figure 11:
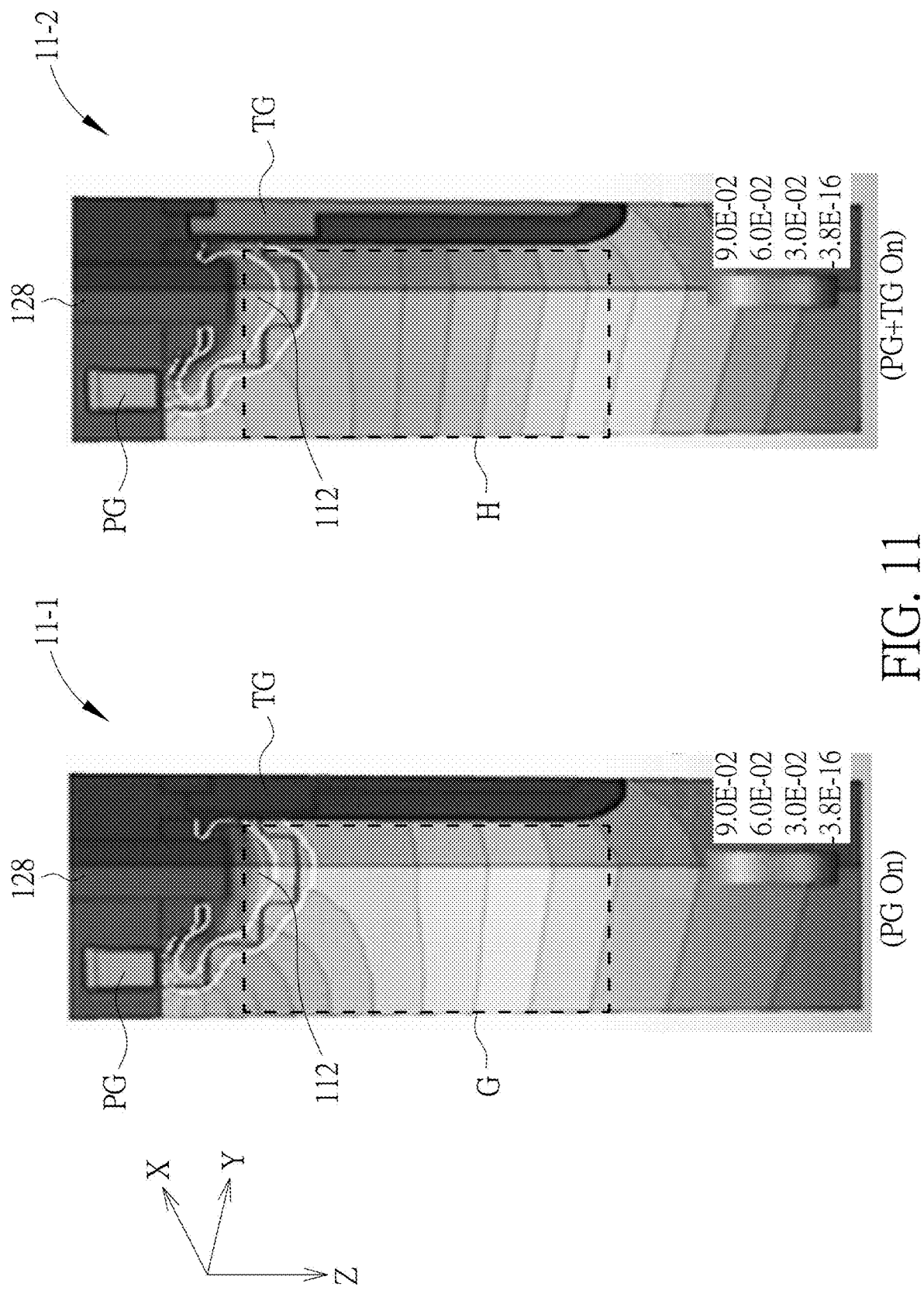

FIG. 11 is a schematic three-dimensional diagram of a voltage equipotential line distribution in a local area of a semiconductor device according to an embodiment of the present disclosure, where a voltage equipotential line distribution 11-1 represents the voltage state when only the planar gate is turned on (PG On), and a voltage equipotential line distribution 11-2 represents the voltage state when both the planar gate and the trench gate are turned on (PG+TG On). Through comparing an area G of the voltage equipotential line distribution 11-1 and an area H of the voltage equipotential line distribution 11-2 in FIG. 11, it shows that when both the planar gate and the trench gate are turned on (PG+TG On), the voltage distribution of a region in the area H adjacent to the trench gate (TG) is relatively uniform (for example, about 6.0E-02 volts (V)), and when only the planar gate is turned on (PG On), the voltage distribution of a region in the area G adjacent to the trench gate (TG) is less uniform (for example, about 6.0E-02 to 9.0E-02 V). It means that when the planar gate and the trench gate of the embodiments of the present disclosure are both turned on, the voltage of the semiconductor devices is significantly distributed, which is beneficial to the application of high-power transistors.

Figure 12:
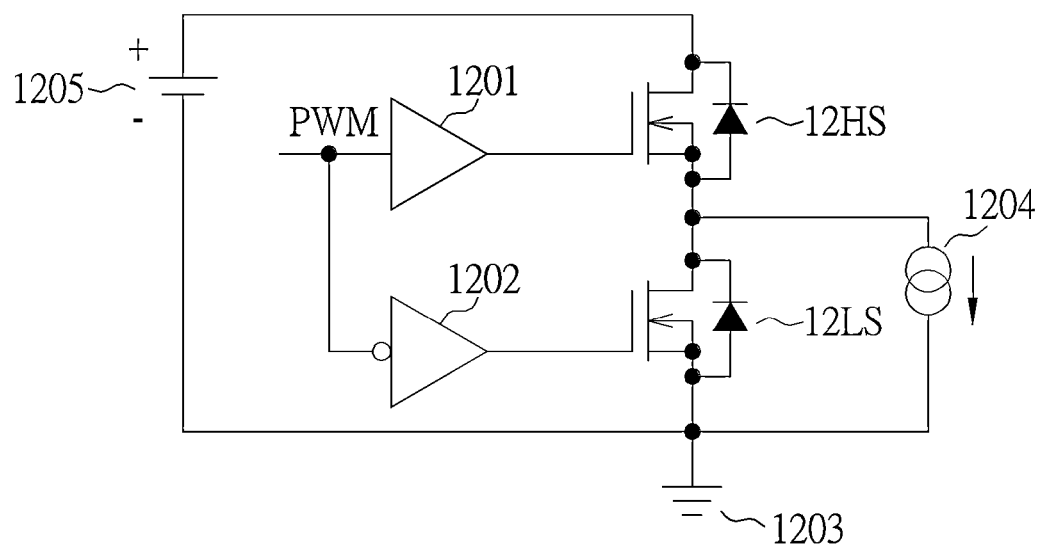
FIG. 12 illustrates a half-bridge circuit using a semiconductor device according to an embodiment of the present disclosure.

FIG. 12 illustrates a half-bridge circuit using a semiconductor device according to an embodiment of the present disclosure. As shown in FIG. 12, the half-bridge circuit includes a high-voltage field effect transistor (high side FET) 12HS and a low-voltage field effect transistor (low side FET) 12LS. The gate of the high side FET 12HS is connected to a driver 1201. The gate of the low side FET 12LS is connected to another driver 1202. The drivers 1201 and 1202 receive pulse-width modulation (PWM) signal. The drain of the high side FET 12HS is connected to a power supply 1205. The source of the low side FET 12LS is connected to a ground terminal 1203. The drain of the low side FET 12LS is connected to the source of the high side FET 12HS. The current direction of a load 1204 is from the source of the high side FET 12HS to the source of the low side FET 12LS. According to the embodiments of the present disclosure, the low side FET 12LS in the half-bridge circuit may use the planar gate of the semiconductor device 100 as its gate, thereby improving the switching speed of the low side FET 12LS. The high side FET 12HS in the half-bridge circuit may use both the planar gate and the trench gate of the semiconductor device 100 as its gate, thereby reducing all of the switching loss, the gate-drain charge (Qgd) (also referred to as Miller charge), the gate charge (Qg), and the on-state resistance (Ron) of the high side FET 12HS. When compared with a high side FET using only a trench gate (single gate), the high side FET using both the planar gate and the trench gate (dual gate) of the embodiments of the present disclosure can reduce the gate-drain charge (Qgd) by about 40% and reduce the switching losses by about 40%, thereby improving the output power efficiency of the semiconductor device by about 1%. In addition, the low side FET using the planar gate of the embodiments of the present disclosure can also improve the control ability of process, so that the channel length of the low side FET is shortened, thereby reducing the area of the low side FET by about 30% to satisfy the requirement of chip size reduction. Therefore, the semiconductor devices of the embodiments of the present disclosure are beneficial to the applications of chip products with high-power, high-density, high-frequency, and miniaturized size, and the power consumption of the semiconductor devices of the present disclosure is also low.

Figure 13:
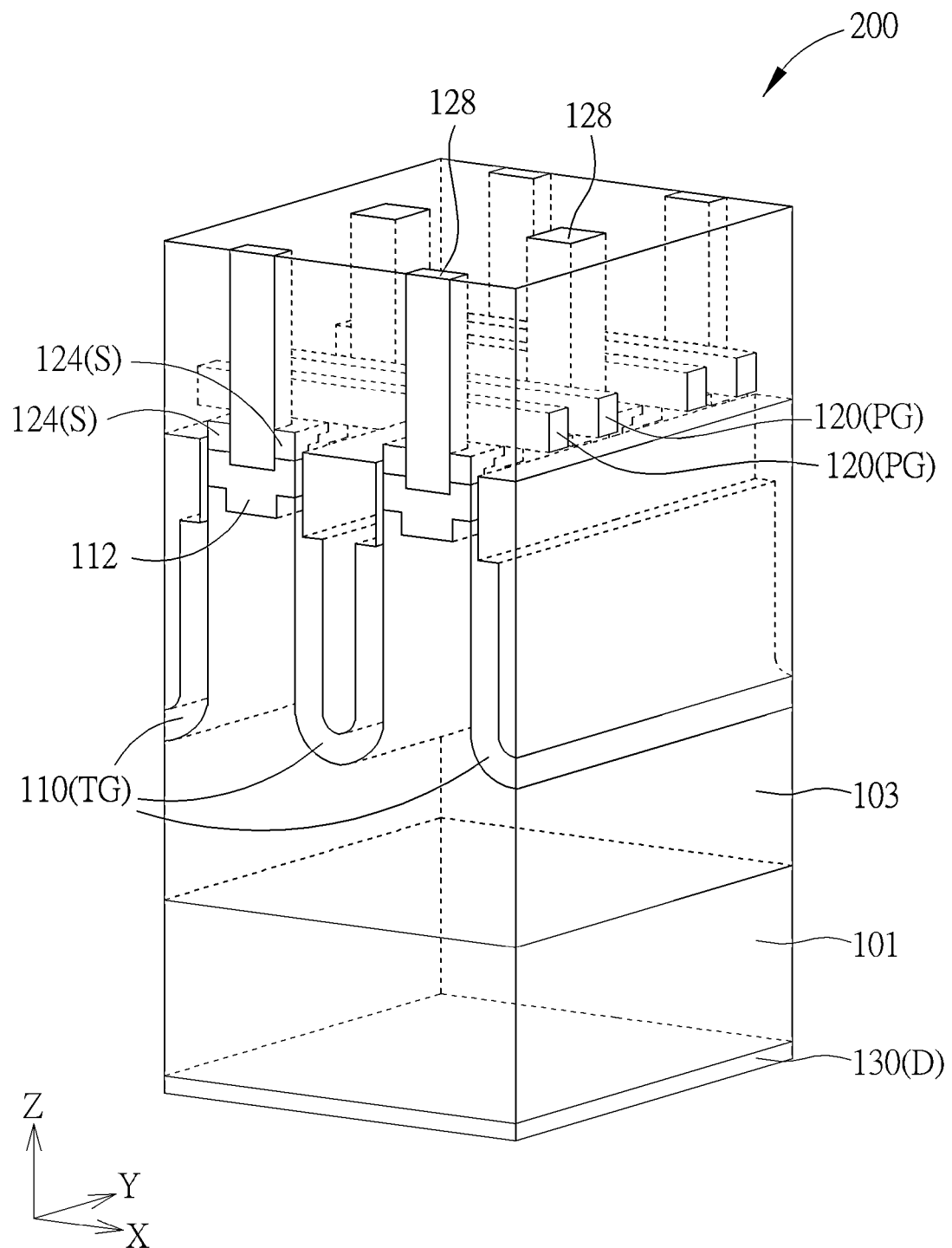
FIG. 13 is a schematic perspective view of four continuous repeating units of a semiconductor device according to an embodiment of the present disclosure.

FIG. 13 is a schematic perspective view of four continuous repeating units of a semiconductor device according to an embodiment of the present disclosure. A repeating unit of the semiconductor device 100 of FIG. 1 may be repeatedly arranged along the first direction (for example, the Y-axis direction) and the second direction (for example, the X-axis direction) to form a chip product with a matrix arrangement of the repeating units. FIG. 13 is a schematic perspective view of a semiconductor device 200 showing four repeating units arranged in a 2×2 matrix. In some embodiments, the size of one repeating unit of the semiconductor device 100 of FIG. 1 is between 0.5×0.5 square micrometers ($\mu m^2$) and 3×3 $\mu m^2$, and a chip size is between 0.5×0.5 square millimeters ($mm^2$) and 15×15 $mm^2$, i.e., a chip product may contain several millions of repeating units arranged in a matrix. As shown in FIG. 13, the long axes of the planar gates (PG) 120 are substantially parallel to each other, and extended along the second direction (for example, the X-axis direction) and across several repeating units. Two planar gates (PG) of one repeating unit are disposed between two source electrodes 128. The long axes of the trench gates (TG) 110 are substantially parallel to each other, and extended along the first direction (for example, the Y-axis direction) and across several repeating units. The extension direction of the planar gate (PG) 120 may be perpendicular to the extension direction of the trench gate (TG) 110. The source electrodes 128 extend downward into the respective body regions 112. The body regions 112 are separated from each other along the first direction (for example, the Y-axis direction). The body regions 112 are disposed between two trench gates (TG) 110. The source region 124 is located in the body region 112 and surrounds the bottom portion of the source electrode 128. The drain electrode 130 is disposed on the bottom surface of the substrate 101.

The semiconductor devices of the embodiments of the present disclosure may include power metal oxide semiconductor field effect transistors (power MOSFET) that include a trench gate and a planar gate, and the planar gate (PG) and the trench gate (TG) are used to form multiple channels that include horizontal channels and vertical channels. When the load power is low, the planar gate may be turned on to speedup the switching speed of the semiconductor devices. When the load power is high, the trench gate and the planar gate may be both turned on to reduce the on-state resistance of the semiconductor devices. Moreover, the trench gate may also provide good electric field shielding effect to distribute the voltage, thereby increasing the breakdown voltage of the semiconductor devices, and the planar gate may improve the control ability of process to shorten the channel length, thereby reducing the chip area and increasing the layout density of transistors. In addition, the semiconductor devices of the present disclosure achieve all the reductions of the gate-drain charge (Qgd), the gate-drain capacitance (Cgd), the gate charge (Qg), and the gate capacitance (Cg), thereby increasing the current and reducing the switching loss of the semiconductor devices, which is beneficial to the applications of chip products with high-power, high-density, high-frequency, and reduced size, and the power consumption of the semiconductor devices is also low.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a substrate;
an epitaxial layer, disposed on the substrate;
a first body region, disposed in the epitaxial layer;
a first trench gate structure, disposed in the epitaxial layer, extended along a first direction, and adjacent to the first body region;
a first planar gate, disposed on the epitaxial layer, extended along a second direction, and at least a portion of the first planar gate located directly above the first body region, wherein the second direction and the first direction have a non-zero included angle therebetween;
a first source electrode, disposed on the epitaxial layer and extended downward into the first body region;
a first source region, disposed in the first body region, and at least a portion of the first source region adjacent to the first source electrode; and
a drain electrode, disposed under the substrate.

2. The semiconductor device of claim 1, wherein the first direction and a vertical direction define a Y-Z plane, the first direction and the second direction define an X-Y plane, the first body region has a Y-Z direction side surface along the Y-Z plane, the first body region has an X-Y direction top surface along the X-Y plane, the first trench gate structure is adjacent to the Y-Z direction side surface, and the first planar gate is at least partially located directly above the X-Y direction top surface.

3. The semiconductor device of claim 2, wherein the first trench gate structure comprises a field plate disposed under a conductive portion, and the conductive portion and the field plate of the first trench gate structure are separated from each other in the vertical direction.

4. The semiconductor device of claim 3, wherein the field plate receives charges from one of the first source electrode and the conductive portion of the first trench gate structure to determine the potential of the field plate.

5. The semiconductor device of claim 1, wherein the non-zero included angle is 90 degrees and the second direction is perpendicular to the first direction.

6. The semiconductor device of claim 1, wherein the first direction and the second direction define an X-Y plane and the first source region surrounds the first source electrode along the X-Y plane.

7. The semiconductor device of claim 1, further comprising:
a second body region, disposed in the epitaxial layer, separated from the first body region and adjacent to the first trench gate structure;
a second planar gate, disposed on the epitaxial layer, directly above the second body region, and parallel to the first planar gate;
a second source electrode, disposed on the epitaxial layer and extended downward into the second body region; and
a second source region, disposed in the second body region and surrounding the second source electrode.

8. The semiconductor device of claim 7, wherein the first planar gate and the second planar gate both are disposed between the first source electrode and the second source electrode, the first planar gate and the second planar gate have extension directions that are parallel to a surface of the substrate, the extension directions of the first source electrode and the second source electrode are perpendicular to the surface of the substrate.

9. The semiconductor device of claim 7, further comprising a second trench gate structure, disposed in the epitaxial layer, parallel to the first trench gate structure, and adjacent to the first body region and the second body region, wherein the first body region and the second body region are both disposed between the first trench gate structure and the second trench gate structure.

10. The semiconductor device of claim 9, wherein the first direction and a vertical direction define a Y-Z plane, and in a direction parallel to the Y-Z plane, the first body region has a first Y-Z direction side surface and a second Y-Z direction side surface that are opposite to each other, the second body region has a third Y-Z direction side surface and a fourth Y-Z direction side surface that are opposite to each other, the first trench gate structure is adjacent to the first Y-Z direction side surface and the third Y-Z direction side surface, and the second trench gate structure is adjacent to the second Y-Z direction side surface and the fourth Y-Z direction side surface.

11. The semiconductor device of claim 9, wherein the first direction and the second direction define an X-Y plane, and in a direction parallel to the X-Y plane, the first body region has a first body central region and a first body peripheral region, the first source region is adjacent to the first body central region, the first planar gate is extended along the second direction and sequentially across over the first trench gate structure, the first body peripheral region and the second trench gate structure.

12. The semiconductor device of claim 11, wherein the first source electrode is extended downward along a vertical direction and toward the first body central region, and in the direction of the X-Y plane, the first source region surrounds a bottom portion of the first source electrode.

13. The semiconductor device of claim 9, wherein the first direction and the second direction define an X-Y plane, and in a direction parallel to the X-Y plane, the second body region has a second body central region and a second body peripheral region, the second source region is adjacent to the second body central region, the second planar gate is extended along the second direction and sequentially across over the first trench gate structure, the second body peripheral region and the second trench gate structure.

14. The semiconductor device of claim 13, wherein the second source electrode is extended downward along a vertical direction and toward the second body central region, and in the direction of the X-Y plane, the second source region surrounds a bottom portion of the second source electrode.

15. The semiconductor device of claim 7, wherein the first trench gate structure comprises:
a first conductive portion;
a second conductive portion, disposed under the first conductive portion;
a first dielectric layer, surrounding the first conductive portion;
a second dielectric layer, surrounding the second conductive portion; and
a dielectric cap layer, disposed on the first conductive portion, wherein the dielectric cap layer is disposed between the first planar gate and the first conductive portion, and between the second planar gate and the first conductive portion.

16. The semiconductor device of claim 15, wherein the thickness of the first dielectric layer is smaller than the thickness of the second dielectric layer and the width of the first conductive portion is greater than the width of the second conductive portion in the second direction.

17. The semiconductor device of claim 1, wherein the first direction and a vertical direction define a Y-Z plane, the position of the first planar gate is higher than the position of the first source region, a bottom surface of the first body region is extended and gradually descended from the first planar gate to the first source electrode, the first body region has a flat Y-Z direction side surface along the Y-Z plane, and the first trench gate structure is adjacent to the flat Y-Z direction side surface.

18. A method of fabricating a semiconductor device, comprising:
providing a substrate and forming an epitaxial layer on the substrate;
forming a trench gate structure in the epitaxial layer, wherein the trench gate structure is extended along a first direction;
forming a body region in the epitaxial layer, wherein the body region is adjacent to the trench gate structure;
forming a planar gate on the epitaxial layer and located directly above the body region and the trench gate structure, wherein the planar gate is extended along a second direction, and the second direction is perpendicular to the first direction;
forming a source region in the body region;
forming an interlayer dielectric layer on the epitaxial layer and covering the planar gate;
forming a source electrode in the interlayer dielectric layer, wherein the source electrode is extended downward to pass through the source region and into the body region; and
forming a drain electrode under the substrate.

19. The method of fabricating a semiconductor device of claim 18, wherein forming the body region comprises performing a plurality of ion implantation processes, the ion implantation processes using different implantation energies and implanting ions of the same conductivity type into the epitaxial layer to form the body region with a multi-step shaped bottom surface or a multi-arc shaped bottom surface.

20. The method of fabricating a semiconductor device of claim 18, wherein forming the trench gate structure comprises:
forming a trench in the epitaxial layer;
forming a first dielectric layer surrounding a first conductive portion in the trench;
forming a second dielectric layer surrounding a second conductive portion in the trench; and
forming a dielectric cap layer on the first conductive portion in the trench, wherein the second conductive portion is located under the first conductive portion, the thickness of the first dielectric layer is smaller than the thickness of the second dielectric layer, and the width of the first conductive portion is greater than the width of the second conductive portion in the second direction.

* * * * *